US008679873B2

(12) United States Patent
Pan et al.

(10) Patent No.: US 8,679,873 B2
(45) Date of Patent: Mar. 25, 2014

(54) METHOD FOR FABRICATING OXIDE-CONFINED VERTICAL-CAVITY SURFACE-EMITTING LASER

(75) Inventors: Jin Shan Pan, Hsinchu (TW); Cheng Ju Wu, Hsinchu County (TW); I Han Wu, Taichung County (TW); Kuo Fong Tseng, Taipei (TW)

(73) Assignee: TrueLight Corp. (TW)

( * ) Notice: Subject to any disclaimer, the term of this patent is extended or adjusted under 35 U.S.C. 154(b) by 852 days.

(21) Appl. No.: 12/653,349

(22) Filed: Dec. 11, 2009

(65) Prior Publication Data

US 2011/0086449 A1 Apr. 14, 2011

(30) Foreign Application Priority Data

Oct. 8, 2009 (TW) ................................ 98134059 A

(51) Int. Cl.

*H01L 21/00* (2006.01)
*H01L 33/00* (2010.01)
*H01S 3/04* (2006.01)
*H01S 5/00* (2006.01)

(52) U.S. Cl.

USPC ............ 438/29; 438/32; 257/101; 372/43.01; 372/45.01; 372/50.11; 372/50.1; 372/50.12

(58) Field of Classification Search

USPC ................ 438/29–32; 257/79–103, E33.001, 257/E21.002; 372/43.01–50.23

See application file for complete search history.

(56) References Cited

U.S. PATENT DOCUMENTS 5,886,370 A * 3/1999 Sun et al. ........................ 257/94
7,250,376 B2 * 7/2007 Tanabe et al. ................. 438/778
2001/0019566 A1 * 9/2001 Jewell ............................ 372/43
2004/0156410 A1 * 8/2004 DeBrabander et al. ......... 372/46

* cited by examiner

*Primary Examiner* — Fernando L Toledo
*Assistant Examiner* — Karen Kusumakar

(57) ABSTRACT

The present invention discloses a method for fabricating a heat-resistant, humidity-resistant oxide-confined vertical-cavity surface-emitting laser (VCSEL) by slowing down the oxidizing rate during a VCSEL oxidation process to thereby reduce stress concentration of an oxidation layer and by preventing moisture invasion using a passivation layer disposed on a laser window. The VCSEL device thus fabricated is heat-resistant, humidity-resistant, and highly reliable. In a preferred embodiment, the oxidation process takes place at an oxidizing rate of less than 0.4 μm/min, and the passivation layer is a SiON passivation layer.

4 Claims, 2 Drawing Sheets

METHOD FOR FABRICATING OXIDE-CONFINED VERTICAL-CAVITY SURFACE-EMITTING LASER

BACKGROUND OF INVENTION

1. Field of the Invention

The present invention relates to methods for fabricating oxide-confined vertical-cavity surface-emitting lasers (VCSELs) and, more particularly, to a method for fabricating an oxide-confined VCSEL of enhanced quality by slowing down oxidation to thereby reduce stress caused to an active layer when an oxidation layer is formed.

2. Description of the Prior Art

A conventional process of fabricating an oxide-confined VCSEL typically involves the following steps. Firstly, etching a stacked multi-layer epitaxial substrate in order to form a plurality of trenches on a surface of the substrate. And then, oxidizing one of the stacked layers that is exposed in the trenches so as to define a laser area. However, this process has a drawback, that is, the moisture might invade the layers of the substrate through the trenches, and thus result in failure of actuation of laser.

According to the results of experimental analyses, there are two general causes that may incur the failures for oxide-confined VCSEL devices to emit laser during a composite test involving high temperature, high humidity, and electric current injection. One is the degradation of optical power of the devices, and the other is the cracks formed in the oxidation layer. Further analyses reveal that these failures are basically due to the invasions of moisture in the laser active region and the stress concentrations incurred in the oxidation layer. It is because the invasions of moisture will result in continuous oxidation of the oxidation layer during long-term operation; in addition, during a conventional oxidation process in which the oxidizing rate is generally greater than 0.4 μm/min, stresses are likely to concentrate on the adjacent surfaces of the oxidation layer and thus result in spotty defects. Given lengthy operation, these spotty defects gradually end up as cracks in the oxidation layer. Although, some designs have been disclosed in prior arts to resolve these drawbacks, such like incorporating some features into the laser epitaxial layers in order to reduce the stress concentration of oxidation layer, or optimizing a protective film on the laser window to prevent the moisture from invading. Nevertheless, these prior arts mostly involve in extra or intricate processes and thereby increase the difficulties and costs of the VCSEL fabrication process.

SUMMARY OF INVENTION

The objective of the present invention is to provide a method for fabricating an oxide-confined vertical-cavity surface-emitting laser (VCSEL) with a view to provide a heat-resistant, humidity-resistant laser device. The method of the present invention involves in slowing down the oxidizing rate during the oxidation process in order to reduce the stress concentration of oxidation layer, and preventing the moisture invasion by forming a passivation layer on the laser window.

In order to achieve the above objective, the present invention discloses a method for fabricating an oxide-confined vertical-cavity surface-emitting laser (VCSEL), which comprises the steps of:

providing a laser substrate, the laser substrate comprising: a first mirror, an active layer on the first mirror, a second mirror on the active layer, an oxidation layer disposed in the second mirror, and at least one oxidation trench formed on the second minor, wherein each said oxidation trench is deep enough to allow at least a portion of the oxidation layer to be exposed from an inner wall of the each said oxidation trench;

performing an oxidation process on the laser substrate such that, on the inner wall of each oxidation trench, the at least one exposed portion of the oxidation layer undergoes an oxidation reaction so as to form an insulating area, wherein a rate of the oxidation reaction is less than 0.4 μm/min; and forming at least a contact pad and at least a dielectric layer on the second mirror of the laser substrate, wherein the at least a dielectric layer comprises a SiON passivation layer above the at least one oxidation trench and the second mirror.

According to an embodiment of the present invention, the laser substrate is made of gallium arsenide (GaAs). The first mirror is an n-type distributed Bragg reflector (DBR), and the second mirror is a p-type DBR. The first and second mirrors are made of aluminum gallium arsenide (AlGaAs) of different mole fractions of aluminum, and the oxidation layer in the second mirror has the relatively largest mole fraction of aluminum. The at least a contact pad is made of metal.

According to an embodiment of the present invention, the oxidation process is a wet oxidation process, and the insulating area contains aluminum oxide.

According to an embodiment of the present invention, the rate of the oxidation reaction of the oxidation layer ranges between 0.1 and 0.4 μm/min during the oxidation process. The oxidation process takes place at an oxidation reaction temperature between 410° C. and 425° C., and the rate of the oxidation reaction is regulated by controlling a moisture level, so as for the rate of the oxidation reaction to be between 0.1 and 0.4 μm/min.

BRIEF DESCRIPTION OF THE DRAWINGS

The invention as well as a preferred mode of use, further objectives, and advantages thereof will be best understood by referring to the following detailed description of three preferred embodiments in conjunction with the accompanying drawings, wherein.

DETAILED DESCRIPTION OF PREFERRED EMBODIMENTS

The present invention provides a method for fabricating an oxide-confined vertical-cavity surface-emitting laser (VCSEL). The method involves in slowing down the oxidizing rate during a VCSEL oxidation process to thereby reduce stress of an oxidation layer and preventing moisture invasion using a passivation layer disposed on a laser window, so as to provide a heat-resistant, humidity-resistant, and highly reliable VCSEL device without requiring an extra or intricate process.

Figure 1:
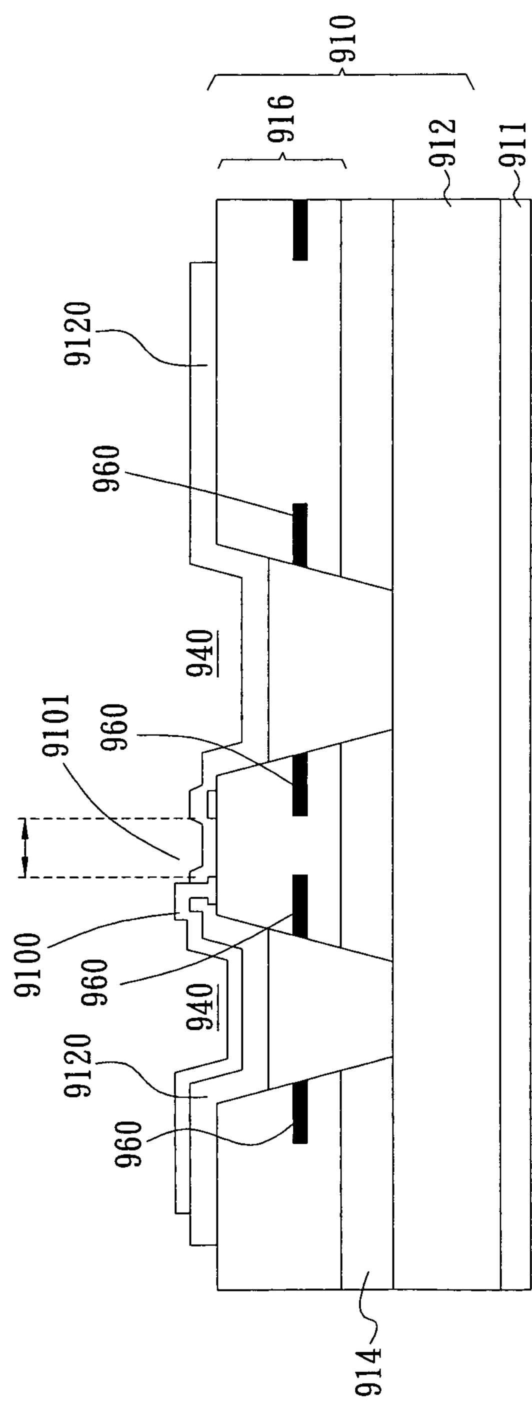
FIG. 1 is a schematic view of the structure of a typical vertical-cavity surface-emitting laser (VCSEL) device.

Please refer to FIG. 1 for a schematic view of the structure of a typical VCSEL device. As shown in the drawing, a laser substrate 910 made of gallium arsenide (GaAs) is provided, wherein the laser substrate 910 is formed, from bottom to top, by molecular beam epitaxy (MBE) or metal organic chemical vapor deposition (MOCVD), with a base layer 911, a first mirror 912, an active layer 914 on the first mirror 912, a second mirror 916 on the active layer 914, an oxidation layer 960 disposed in the second mirror 916, and at least one oxidation trench 940 formed on the second mirror 916 by an etching process. In an embodiment where a VCSEL device is fabricated by wet oxidation, the base layer 911 is made of $n^+$ GaAs, the first mirror 912 is in the form of an n-type distributed Bragg reflector (DBR), and the second mirror 916 is in the form of a p-type DBR. The VCSEL device uses the DBRs above and below the active layer 914 as reflective mirrors so as to create a resonant cavity for emitting laser. The first and second mirrors 912, 916 are made of aluminum gallium arsenide (AlGaAs) of different mole fractions of aluminum. The oxidation layer 960 in the second mirror 916 has the relatively largest mole fraction of aluminum. In general, the mole fraction of aluminum in the oxidation layer 960 sometimes reaches $Al_{0.95}Ga_{0.05}As$ or above so as to form an insulative aluminum oxide layer during an oxidation process.

Referring to FIG. 1 again, two oxidation cavities 940 together define the position of a laser window 9101 therebetween and are deep enough to allow at least a portion of the oxidation layer 960 to be exposed from an inner wall of each oxidation cavities 940. Afterward, a wet oxidation process is performed on the laser substrate 910 such that, on the inner walls of the oxidation cavities 940, the at least one exposed portion of the oxidation layer 960 undergoes an oxidation reaction and thereby forms an aluminum oxide-containing insulating area (located at the same position as that denoted with reference numeral 960 in FIG. 1 and thus hereinafter denoted with reference numeral 960). In this embodiment, the oxidation reaction rate is less than 0.4 μm/min and preferably between 0.1 and 0.4 μm/min. Performing the process at such a low oxidation reaction rate significantly lowers the stress present between the second mirror 916 and the oxidation layer 960 (an insulating area) due to oxidation, greatly reduces spotty defects present on the adjacent surfaces between the second mirror 916 and the oxidation layer 960, and prevents the oxidation layer 960 from cracking.

Afterward, at least a contact pad 9100 made of metal and at least a dielectric layer are formed at predetermined positions on the second mirror 916 of the laser substrate 910. In this embodiment, the at least a dielectric layer includes a SiON passivation layer 9120 above the oxidation trench 940 and the second mirror 916. The SiON passivation layer 9120 is effective in protecting the laser window 9101 defined by the oxidation cavities 940, so as to ward off moisture invasion with a view to providing a heat-resistant, humidity-resistant, and highly reliable VCSEL device. In an embodiment, the passivation layer 9120 is preferably of a thickness substantially equal to one and a half of the wavelength of the laser emitted by the laser device.

The wet oxidation process performed on the oxidation layer 960 at a low oxidation reaction rate, that is, between 0.1 and 0.4 μm/min, according to the present invention is described hereunder.

In general, the two major factors that influence oxidation reaction rate are: (1) the temperature at which an oxidation process takes place, and (2) the amount of moisture introduced during the oxidation process. As the oxidation reaction rate increases/decreases with temperature or moisture, it is feasible to decrease the oxidation reaction rate of the process by decreasing the temperature at which the process takes place or the level of moisture introduced during the process. In this regard, the reduction of temperature makes a marked difference in the oxidation reaction rate. For instance, when the reaction temperature is lowered to less than 400° C. or 390° C., the oxidation reaction rate is greatly reduced, but the process is nevertheless prolonged, thus disadvantageously decreasing the efficiency of production. In a preferred embodiment of the present invention, the oxidation process takes place at a temperature kept above 410° C., such as between 410° C. and 425° C., and the oxidation reaction rate is regulated by controlling the moisture level so as to maintain a low oxidation reaction rate.

The difference between the outcome of an oxidation process performed at high temperature and low oxidizing rate and the outcome of an oxidation process performed at low temperature and low oxidizing rate is as follows. During each oxidation process, aluminum gallium arsenide (AlGaAs) of a high mole fraction of aluminum undergoes an oxidation reaction with water in the moisture to thereby produce an oxidation layer, and the oxidation reaction will not be completed without sufficient chemical energy. At high temperature, the oxidation reaction has access to adequate chemical energy whereby the oxidation reaction can be completed. In consequence, the oxidation layer thus formed is stable and therefore less susceptible to continuous oxidation caused by subsequent moisture invasion during long-term operation. At low temperature and low oxidizing rate, however, the oxidation reaction is incomplete such that the oxidation layer is susceptible to continuous oxidation caused by subsequent moisture invasion during long-term operation, thereby resulting in defect-induced or stress-induced failure of the laser device. The present invention keeps the oxidation reaction temperature of the oxidation process between 410° C. and 425° C. and maintains a low oxidation reaction rate between 0.1 and 0.4 μm/min by controlling the moisture level. Hence, the present invention not only advantageously features the aforesaid significant reduction of spotty defects present on the adjacent surfaces and the protection of the oxidation layer from cracking, but also circumvents drawbacks otherwise incurred at low temperature and low oxidizing rate, such as incomplete reaction and continuous oxidation of the oxidation layer because of moisture invasion during long-term operation.

Figure 2:
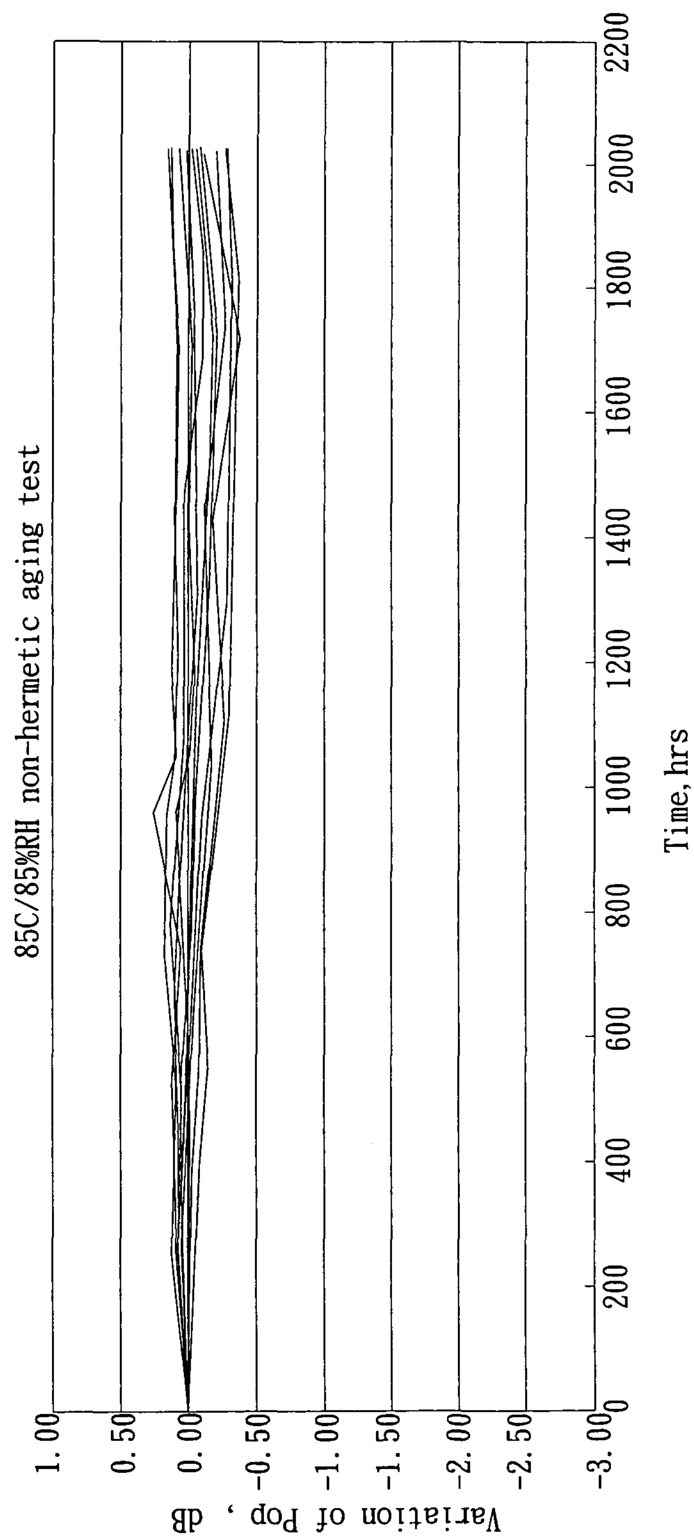
FIG. 2 is a graph for illustrating the results of measurement of variation in the output optical power of laser devices fabricated by a method for fabricating an oxide-confined VCSEL according to the present invention.

FIG. 2 shows a graph for illustrating the results of measurement of variation in the output optical power of a plurality of laser devices fabricated by the method for fabricating an oxide-confined VCSEL according to the present invention. The output optical power of the laser devices is tested under specific measurement conditions, namely a temperature of 85° C., a relative humidity (RH) of 85%, and an operating current Top of 6 mA, for a long period of time, during which the laser devices are in operation. As shown in FIG. 2, the laser devices fabricated by the method for fabricating an oxide-confined VCSEL according to the present invention provide stable operating power and demonstrate excellent laser performance, because the deviation $\Delta P$ of the output optical power of the laser devices measured under the aforesaid measurement conditions always ranges between −0.25 dB and 0.25 dB during operation that lasts for more than 2000 hours. Also, unlike the prior art, the VCSEL fabrication method of the present invention does not require an extra process and thus can be implemented by existing equipment after necessary adjustment is made thereto, without compromising the operation of the production line. Last but not least, with the method of the present invention, it is easy to maintain a low oxidizing rate that leads to satisfactory resistance to high temperature and high humidity. Accordingly, the present invention markedly improves on the prior art in terms of functionality and overcomes the drawbacks of the prior art.

The present invention has been described with preferred embodiments thereof, and it is understood that many changes and modifications to the described embodiment can be carried out without departing from the scope and the spirit of the invention that is intended to be limited only by the appended claims.

What is claimed is:

1. A method for fabricating an oxide-confined vertical-cavity surface-emitting laser (VCSEL), comprising steps of:

providing a laser substrate, the laser substrate comprising: a first mirror, an active layer on the first mirror, a second mirror on the active layer, an oxidation layer disposed in the second mirror, and at least one oxidation trench formed on the second mirror, wherein each said oxidation trench is deep enough to allow at least a portion of the oxidation layer to be exposed from an inner wall of the each said oxidation trench;

performing an oxidation process on the laser substrate such that, on the inner wall of each said oxidation trench, the at least one exposed portion of the oxidation layer undergoes an oxidation reaction so as to form an insulating area, wherein the oxidation process takes place at an oxidation reaction temperature between 410° C. and 425° C. and with a rate of the oxidation reaction between 0.1 μm/min and 0.4 μm/min, in which the rate is regulated by controlling a moisture level; and forming at least a contact pad and at least a dielectric layer on the second mirror of the laser substrate, wherein the at least a dielectric layer comprises a SiON passivation layer above the at least one oxidation trench and the second mirror;

wherein the first and second mirrors are made of aluminum gallium arsenide (AlGaAs) of different mole fractions of aluminum, and the oxidation layer in the second mirror has the relatively largest mole fraction of aluminum; the oxidation process is a wet oxidation process, and the insulating area contains aluminum oxide.

2. The method of claim 1, wherein the laser substrate is made of gallium arsenide (GaAs).

3. The method of claim 1, wherein the first mirror is an n-type distributed Bragg reflector (DBR), and the second mirror is a p-type DBR.

4. The method of claim 1, wherein the at least a contact pad is made of metal.

* * * * *